US010920782B2

(12) United States Patent
Shen

(10) Patent No.: US 10,920,782 B2
(45) Date of Patent: Feb. 16, 2021

(54) LOW-PROFILE, HIGH-POWER PUMP FOR ELECTRONICS FLUID COOLING SYSTEM

(71) Applicant: Meng Shen, Shenzhen (CN)

(72) Inventor: Meng Shen, Shenzhen (CN)

(73) Assignee: Asia Vital Components (China) Co., Ltd., Shenzhen (CN)

( * ) Notice: Subject to any disclaimer, the term of this patent is extended or adjusted under 35 U.S.C. 154(b) by 36 days.

(21) Appl. No.: 16/261,601

(22) Filed: Jan. 30, 2019

(65) Prior Publication Data

US 2020/0240417 A1 Jul. 30, 2020

(51) Int. Cl.
| | | |
|---|---|---|
| *F04D 13/06* | (2006.01) | |
| *F04D 29/40* | (2006.01) | |
| *F04D 1/00* | (2006.01) | |
| *F04D 25/06* | (2006.01) | |
| *F04D 29/42* | (2006.01) | |
| *F04D 29/44* | (2006.01) | |
| *H05K 7/20* | (2006.01) | |

(52) U.S. Cl.
CPC .............. *F04D 13/06* (2013.01); *F04D 1/00* (2013.01); *F04D 25/0606* (2013.01); *F04D 29/406* (2013.01); *F04D 29/426* (2013.01); *F04D 29/445* (2013.01); *H05K 7/20272* (2013.01)

(58) Field of Classification Search
CPC ........ F04D 1/00; F04D 13/0606; F04D 17/16; F04D 25/0606; F04D 29/406; F04D 29/426; F04D 13/06; H05K 7/20272
See application file for complete search history.

(56) References Cited

U.S. PATENT DOCUMENTS

| | | | | |
|---|---|---|---|---|
| 2005/0249609 A1* | 11/2005 | Ito | ....................... | F04D 13/0673 417/353 |
| 2013/0134827 A1* | 5/2013 | Nagahama | ............. | H02K 15/02 310/216.113 |
| 2014/0205480 A1* | 7/2014 | Nakano | ............... | F04D 29/4273 417/420 |

FOREIGN PATENT DOCUMENTS

| | | |
|---|---|---|
| JP | 2007231867 A | 9/2007 |
| TW | I632299 B | 8/2018 |

* cited by examiner

*Primary Examiner* — Bryan M Lettman
(74) *Attorney, Agent, or Firm* — Thomas J. Nikolai; DeWitt LLP

(57) ABSTRACT

A high-power pump structure includes a housing having a first and an opposite second side; an isolating plate; and a closing member. On the first side, a pump chamber is formed and divided into a first and a second chamber by a partitioning section, which has an end forming a flow-guiding plate. In the second chamber, there is a raised pivot section having a centered receiving opening for connecting with a rotor assembly, such that an annular recess is defined on the second side corresponding to a rear side of the pivot section for receiving a stator assembly. The isolating plate covers the second chamber, so that the second chamber is not directly communicable with the first chamber. The closing member covers the first side of the housing with a communicating chamber formed between the closing member and the isolating plate to communicate with the first and the second chamber.

11 Claims, 9 Drawing Sheets

LOW-PROFILE, HIGH-POWER PUMP FOR ELECTRONICS FLUID COOLING SYSTEM

FIELD OF THE INVENTION

The present invention relates to a pump structure, and more particularly, to a high-power pump structure.

BACKGROUND OF THE INVENTION

While the currently available electronic devices have increasingly enhanced operation performance, the electronic elements therein also produce more heat during operation thereof. Usually, heat radiators or radiation fins with increased heat radiating surfaces are provided on the electronic elements to enable an upgraded heat dissipation effect. However, in view that the heat radiator and radiation fins can provide only very limited heat dissipation effect, water-cooling devices have also been used as a solution to overcome this problem.

According to a conventional water-cooling device, heat absorbed from a heat-producing element, such as a central processing unit or a graphic processing unit, is transferred to a cooling liquid in the water-cooling device through heat exchange; and a pump in the water-cooling device circulates the cooling liquid through the entire water-cooling device. The water-cooling device is connected to a heat radiator via a plurality of tubes, so that the heat-absorbed cooling liquid flows through the heat radiator to exchange heat with the latter to achieve the purpose of quickly carrying heat away from the heat-producing element and quickly dissipating the heat into ambient environment.

The pump for the conventional water-cooling device has a very simple pump chamber design. A water inlet and a water outlet are connected to the same one pump chamber, in which a blade wheel of a rotor assembly rotates and causes the cooling liquid to flow. This pump design fails to effectively pressurize the cooling liquid. In other words, with the conventional pump or rotor assembly, the heat dissipation efficiency of the conventional water-cooling device is very low. If it is desired to increase the flowing speed of the cooling liquid in the water-cooling device, a larger pump must be used in place of the conventional pump. However, the use of a larger pump is obviously not a good idea in view of the present demand for light, thin and small electronic devices.

It is therefore tried by the inventor to develop a high-power pump structure to overcome the disadvantages and problems of the conventional pump structure.

SUMMARY OF THE INVENTION

To effectively solve the problems in the conventional pump structure, a primary object of the present invention is to provide a high-power pump structure that enhances the heat dissipation efficiency of a water-cooling device.

To achieve the above and other objects, the high-power pump structure according to the present invention includes a housing, a rotor assembly, an isolating plate, a stator assembly and a closing member. The housing has a first side and an opposite second side. On the first side, there is formed an upward-opened pump chamber and a partitioning section; the partitioning section divides the pump chamber into a first chamber and a second chamber and includes a flow-guiding plate formed at an end thereof. The second chamber has a pivot section raised therefrom, and the pivot section has a centered receiving opening. On the second side, there is formed a downward-opened annular recess, which is correspondingly defined on a rear or bottom side of the raised pivot section. The rotor assembly is located in the second chamber and includes a blade wheel and a magnetic element. The magnetic element is selectively fitted around an outer side of the pivot section or in the receiving opening of the pivot section. The blade wheel includes a rotary shaft, which is downward extended from the blade wheel to selectively insert into the receiving opening of the pivot section in the case the magnetic element is fitted around the outer side of the pivot section, or into a through hole of the magnetic element in the case the magnetic element is fitted in the receiving opening of the pivot section. The isolating plate covers around the rotor assembly and a top of the second chamber, such that the second chamber is not directly communicable with the first chamber. The stator assemble is fitted in the annular recess. The closing member is correspondingly covered on the first side of the housing with a communicating chamber formed between the closing member and the isolating plate; and the communicating chamber is communicable with the first and the second chamber.

In an embodiment of the present invention, the flow-guiding plate is integrally formed with the partitioning section to create a flow guiding effect.

In an embodiment of the present invention, the annular recess has a plurality of axially extended ribs spaced on along a radially inner circumferential wall of the annular recess, such that a space is formed between any two adjacent ribs.

In an embodiment of the present invention, the stator assembly includes a plurality of poles, which are respectively located in the spaces formed between any two adjacent ribs.

In an embodiment of the present invention, the housing further includes a water inlet and a water outlet provided on a peripheral wall thereof to communicate with the first chamber and the second chamber, respectively.

In an embodiment of the present invention, the receiving opening of the pivot section is provided on an inner circumferential wall with a plurality of axially extended grooves, and the grooves are communicable with the second chamber.

In an embodiment of the present invention, the isolating plate has a top surface and a bottom surface. The top surface is located at a small distance below the closing member, and the bottom surface covers around the rotor assembly.

In an embodiment of the present invention, the radially inner circumferential wall of the annular recess forms a downward extended fitting sleeve, which is correspondingly defined on a rear side of the receiving opening of the pivot section; and the stator assembly consists of a plurality of silicon steel sheets and has a central opening. The central opening of the stator assembly is fitted around the fitting sleeve.

In an embodiment of the present invention, the rotor assembly is an inner-rotor assembly, such that the rotary shaft of the blade wheel is inserted into the through hole of the magnetic element and the magnetic element is fitted in receiving opening of the pivot section.

In an embodiment of the present invention, the rotor assembly is an outer-rotor assembly, such that the through hole of the magnetic element is fitted around the outer side of the pivot section and the rotary shaft of the blade wheel is inserted into the receiving opening of the pivot section.

In an embodiment of the present invention, the housing further includes a stator cover, which correspondingly covers the stator assembly and has a control circuit provided thereon.

In an embodiment of the present invention, the housing further includes a locating groove provided on a top of the first side around the pump chamber, and a sealing element correspondingly fitted in the locating groove.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
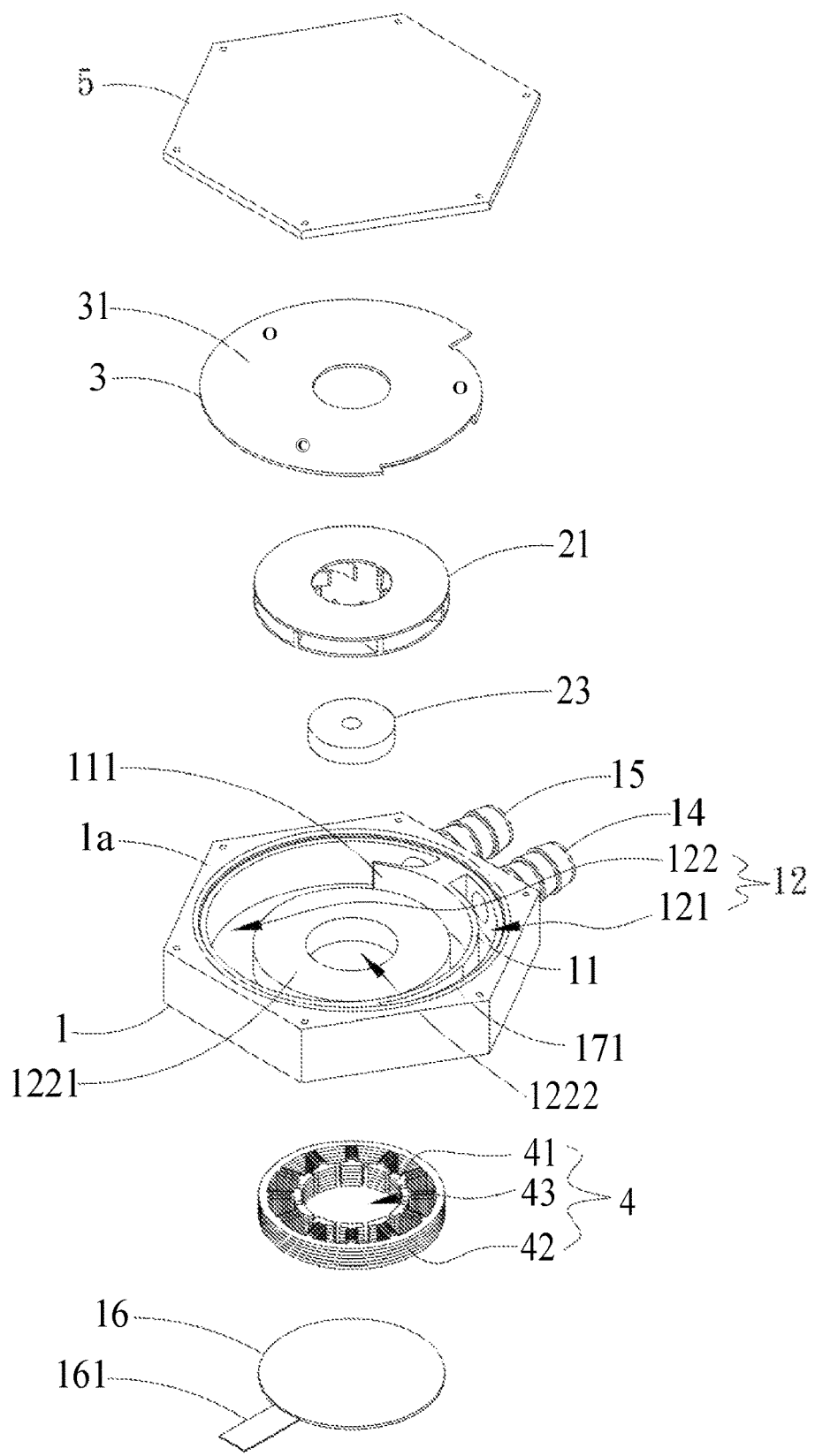
FIG. 1A is an exploded top perspective view of a high-power pump structure according to a first embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 1B:
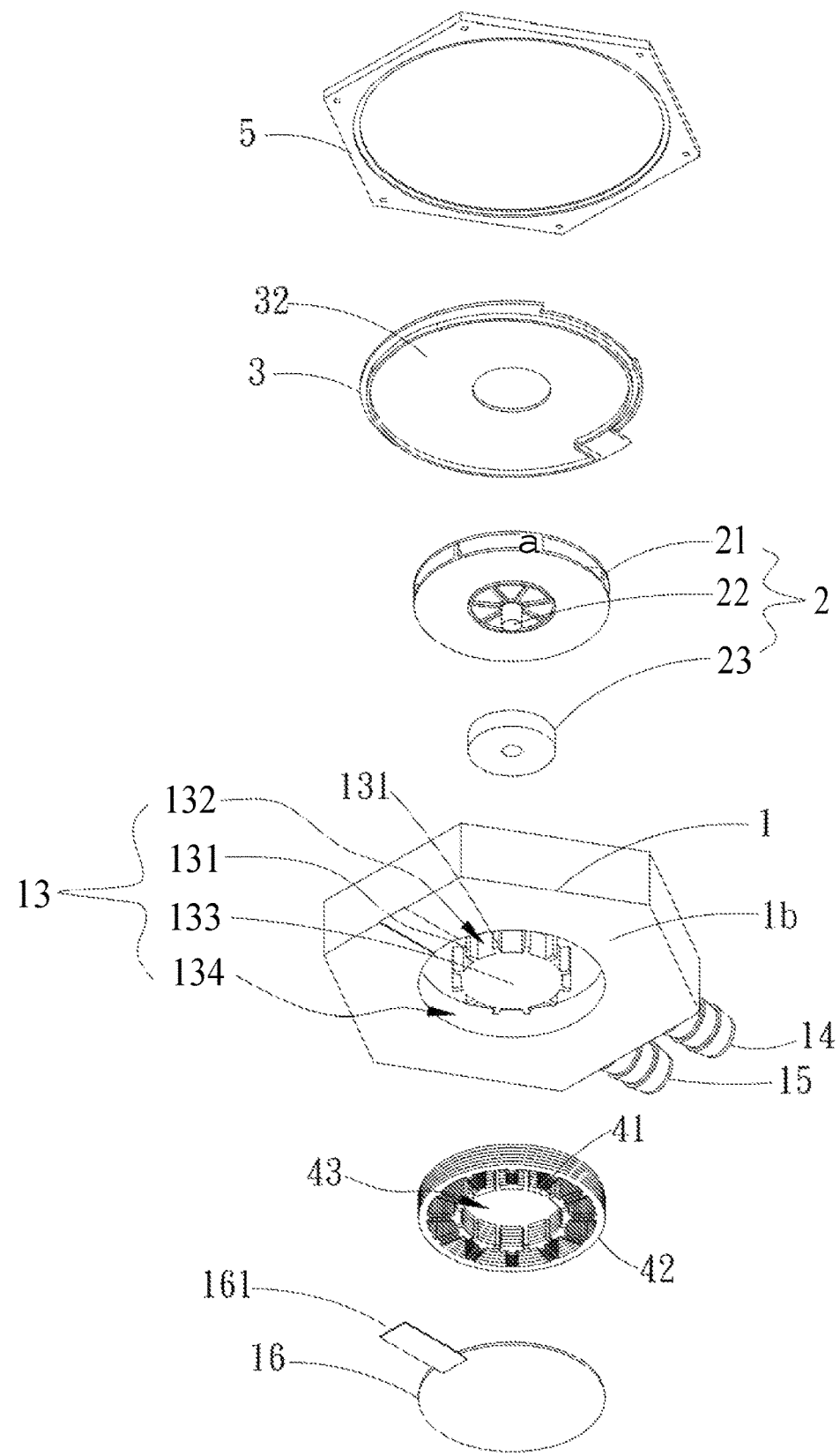
FIG. 1B is an exploded bottom perspective view of the high-power pump structure according to the first embodiment of the present invention.
Figure 1C:
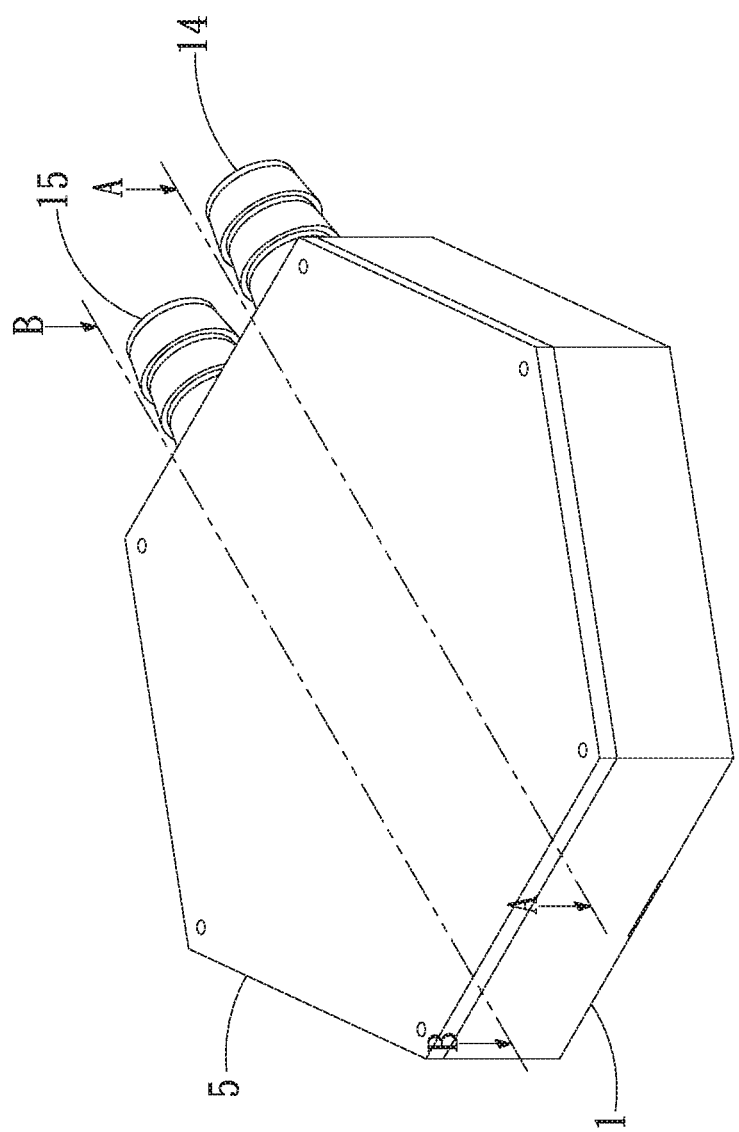
FIG. 1C is an assembled top perspective view of the high-power pump structure according to the first embodiment of the present invention.

Please refer to FIGS. 1A and 1B that are exploded top and bottom perspective views, respectively, of a high-power pump structure according to a first embodiment of the present invention; and to FIG. 1C that is an assembled top perspective view of the high-power pump structure according to the first embodiment of the present invention. For the purpose of conciseness and clarity, the high-power pump structure of the present invention is also briefly referred to as the pump structure herein. As shown, the pump structure according to the first embodiment of the present invention includes a housing 1, a rotor assembly 2, an isolating plate 3, a stator assembly 4 and a closing member 5. The rotor assembly 2 and the stator assembly 4 are mounted in the housing 1; and the isolating plate 3 and the closing member 5 are sequentially mounted to a top of the housing 1 to complete the pump structure. In the first embodiment, the pump structure includes an inner-rotor assembly.

Figure 1D:
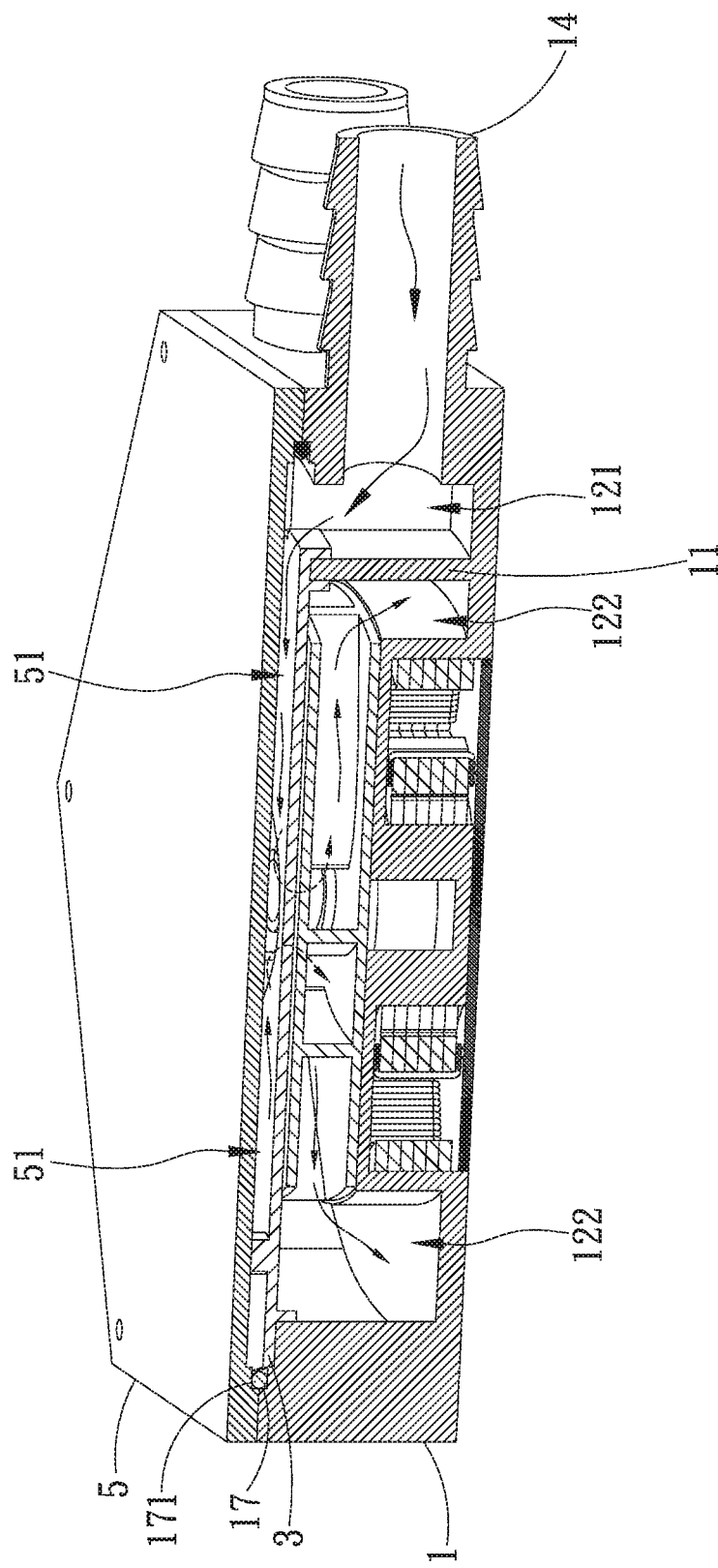
FIG. 1D is a sectional view taken along line A-A of FIG. 1C.

The housing 1 has a first side 1a and an opposite second side 1b. On the first side 1a, there is provided a partitioning section 11 and an upward-opened pump chamber 12. The partitioning section 11 is upward extended from the first side 1a to divide the pump chamber 12 into a first chamber 121 and a second chamber 122. A water inlet 14 and a water outlet 15 are provided on an upright peripheral wall of the housing 1 to communicate with the first chamber 121 and the second chamber 122, respectively. As can be most clearly seen in FIG. 2, the upright peripheral wall of the housing 1 has a curved inner surface; and the partitioning section 11 is also a curved section. An end of the partitioning section 11 farther away from the upright peripheral wall of the housing 1 is formed into a curved flow-guiding plate 111, which is located corresponding to the water outlet 15 to create a flow-guiding effect. A pivot section 1221 having a centered receiving opening 1222 is raised in from the second chamber 122. As can be seen in FIG. 1D, which is a sectional view taken along line A-A of FIG. 1C, a locating groove 17 is formed on a top of the first side 1a of the housing 1 around the pump chamber 12; and a sealing element 171 is correspondingly fitted in the locating groove 17.

On the second side 1b of the housing 1, there is formed a downward-opened annular recess 13, in which the stator assembly 4 is fitted. More specifically, the annular recess 13 is defined on a rear or bottom side of the raised pivot section 1221. A plurality of axially extended ribs 131 are spaced on along a radially inner circumferential wall of the annular recess 13, such that a space 132 is formed between any two adjacent ribs 131. The ribs 131 give the radially inner circumferential wall of the annular recess 13 a reinforced structural strength. The annular recess 13 has a downward-opened annular space 134 and a downward extended fitting sleeve 133, which is defined by the radially inner circumferential wall of the annular recess 13 and centered in the annular space 134.

The pump structure according to the first embodiment includes an inner-rotor assembly. In this embodiment, the rotor assembly 2 is located in the second chamber 122, and includes a blade wheel 21 and a magnetic element 23; a rotary shaft 22 is downward extended from one side of the blade wheel 21 that faces toward the pivot section 1221 for extending into a through hole 231 formed on the magnetic element 23; and the magnetic element 23 is located in the receiving opening 1222 of the pivot section 1221. With these arrangements, the magnetic element 23 is located corresponding to the stator assembly 4 with the radially inner peripheral wall of the annular recess 13 disposed between them.

The isolating plate 3 covers a top of the second chamber 12, and has a top surface 31 and a bottom surface 32. The top surface 31 is located at a small distance below the closing member 5, and the bottom surface 32 covers around the rotor assembly 2.

The stator assembly 4 is fitted in the annular recess 13, and consists of a plurality of stacked silicon steel sheets 42. The stator assembly 4 further includes a plurality of poles 41 and has a central opening 43 defined at a center thereof. The poles 41 can be T-shaped without being limited thereto. The stator assembly 4 is fitted in the annular recess 13 with the central opening 43 fitted around the fitting sleeve 133 and the poles 41 respectively disposed in the spaces 132 formed between any two adjacent ribs 131. A stator cover 16 can be connected to the open bottom of the annular recess 13 to correspondingly covers the stator assembly 4 fitted in the annular recess 13. A control circuit 161 is provided on a surface of the stator cover 16.

The closing member 5 is correspondingly covered on the first side 1a of the housing 1. With the small distance between the top surface 31 of the isolating plate 3 and the closing member 5, a communicating chamber 51 is formed between the isolating plate 3 and the closing member 5 to communicate with the first chamber 121 and the second chamber 122.

Figure 1E:
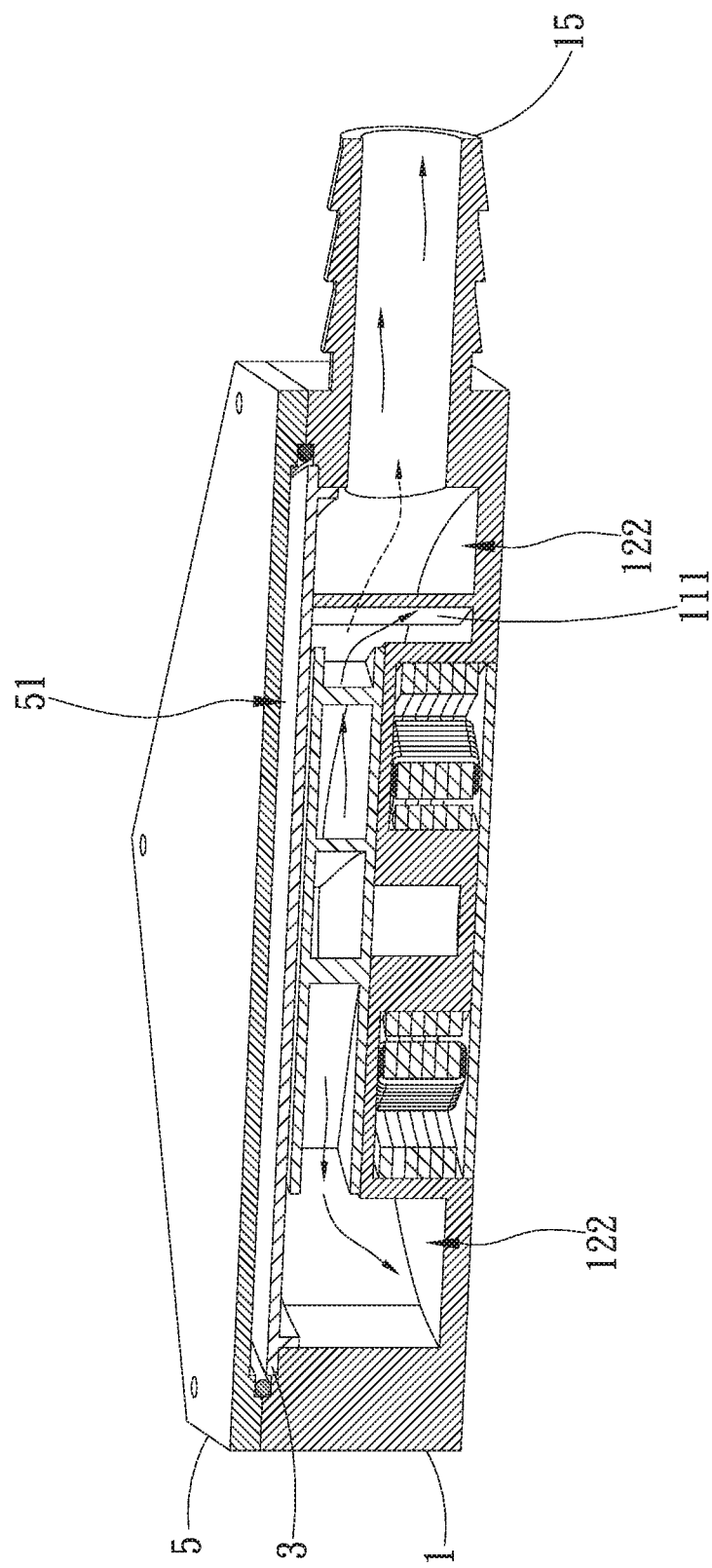
FIG. 1E is a sectional view taken along line B-B of FIG. 1C.

FIG. 1E is a sectional view taken along line B-B of FIG. 1C. Please refer to FIGS. 1D and 1E at the same time. When the pump structure of the present invention is in use, the water outlet 15 is connected to a water block (not shown), and the water inlet 14 is connected to a water-cooling radiator (not shown). The water block and the water-cooling radiator are serially connected to constitute a complete water-cooling circulation system. When the pump structure operates, the blade wheel 21 of the rotor assembly 2 rotates to generate a push force against a working liquid, bringing the latter to flow in the second chamber 122 along the curved inner surface of the housing 1. Under the guiding of the flow-guiding plate 111, the pressurized working liquid quickly leaves the second chamber 122 via the water outlet 15, as shown in FIG. 1E. Then, the working liquid sequentially passes through the water block and the water-cooling radiator (not shown) to enter the first chamber 121 via the water inlet 14. Thereafter, the working liquid flows along the communicating chamber 51 and passes over the isolating plate 3 to enter the second chamber 122 again and complete one cycle of circulation in the water-cooling circulation system.

With the above arrangements of the present invention, the poles 41 of the stator assembly 4 are located closer to the magnetic element 23 located in the receiving opening 1222. In this manner, the mutual electromagnetic induction and magnetic field generation between the poles 41 and the magnetic element 23 is largely enhanced, enabling the rotor assembly 2 to operate in increased efficiency and ensure upgraded overall heat dissipation efficiency of the water-cooling device. Further, the second chamber 122, the partitioning section 11 and the flow-guiding plate 111 together define a circular inner wall structure in the housing 1, such that the blade wheel 21 is equally spaced from any point on the second chamber 122, the partitioning section 11 and the flow-guiding plate 111. With this structure, the working liquid is subjected to a uniform push force from the blade wheel 21 and can therefore accelerate quickly to flow without too much resistance, which enables largely increased working efficiency of the pump structure.

Figure 2:
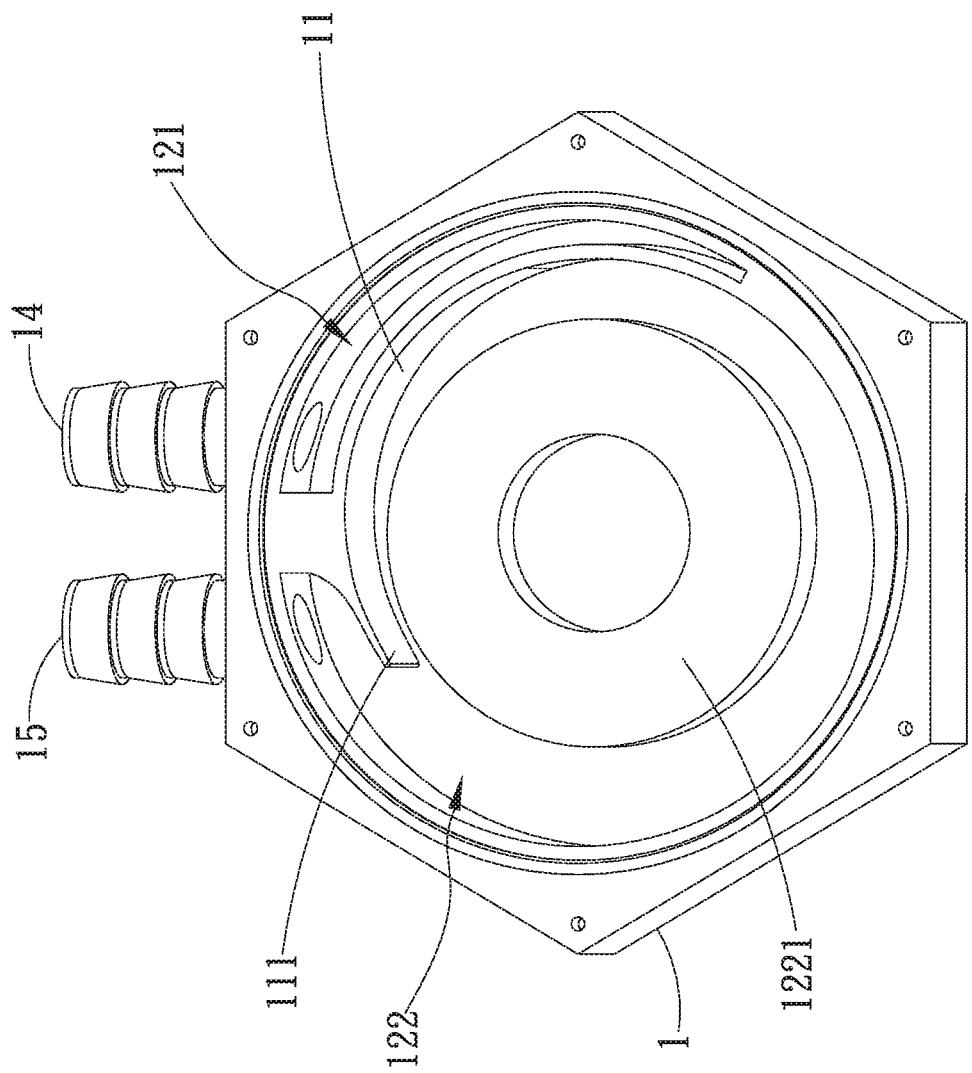
FIG. 2 is an assembled top perspective view of a housing of the high-power pump structure according to the first embodiment of the present invention.

What is to be noted is the flow-guiding plate 111 should not be too short in length. Preferably, the flow-guiding plate 111 is long enough for correspondingly shielding a space located directly in front of the water outlet 15, as shown in FIG. 2, so as to prevent the working liquid entering the second chamber 122 via the communicating chamber 51 from moving toward the water outlet 15 directly and at the same time forces the working liquid to fully accelerate in the second chamber 122 before leaving the second chamber 122 via the water outlet 15. In this manner, less turbulent flow of the working liquid would occur in the second chamber 122.

Figure 3A:
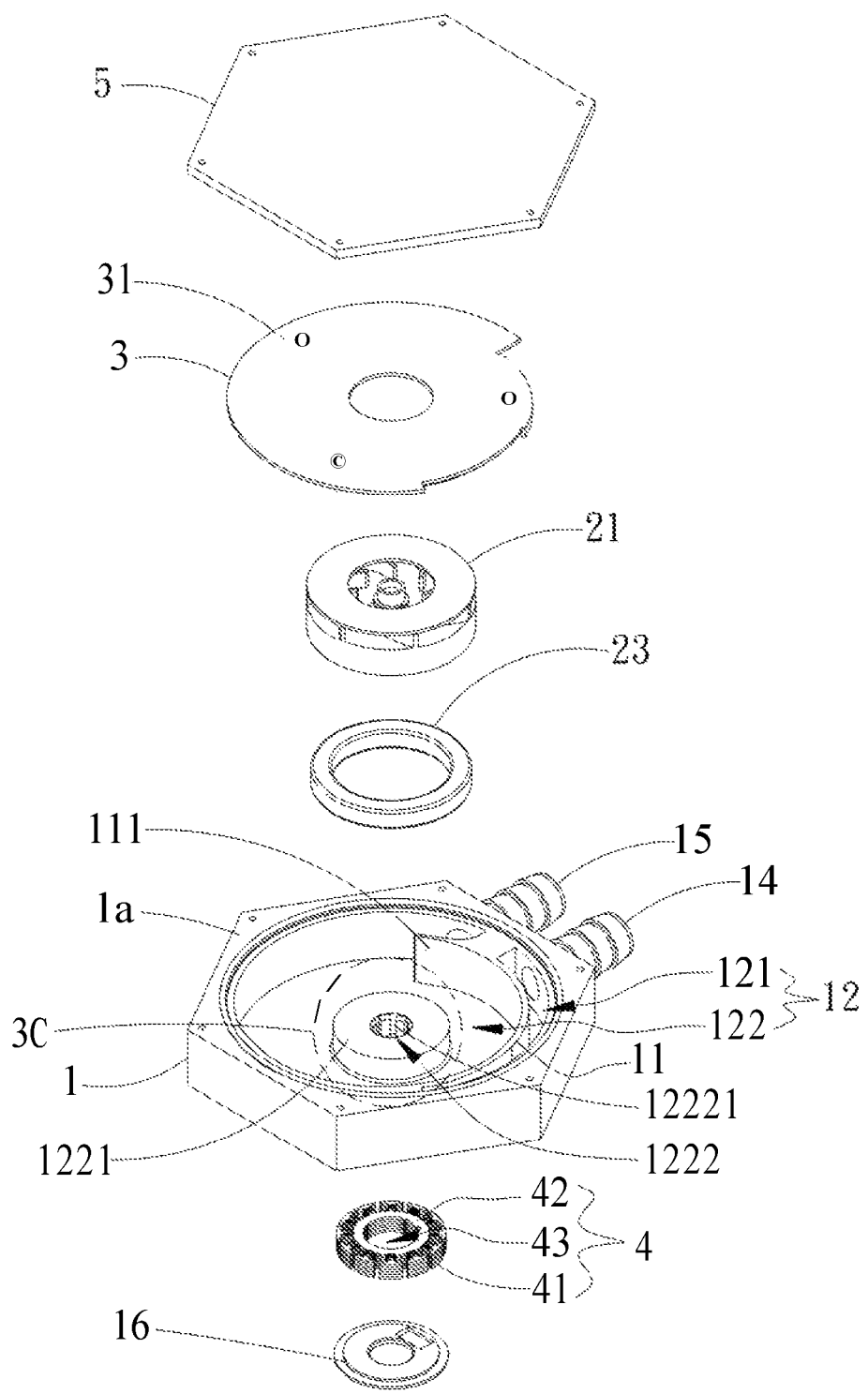
FIG. 3A is an exploded top perspective view of a high-power pump structure according to a second embodiment of the present invention.
Figure 3B:
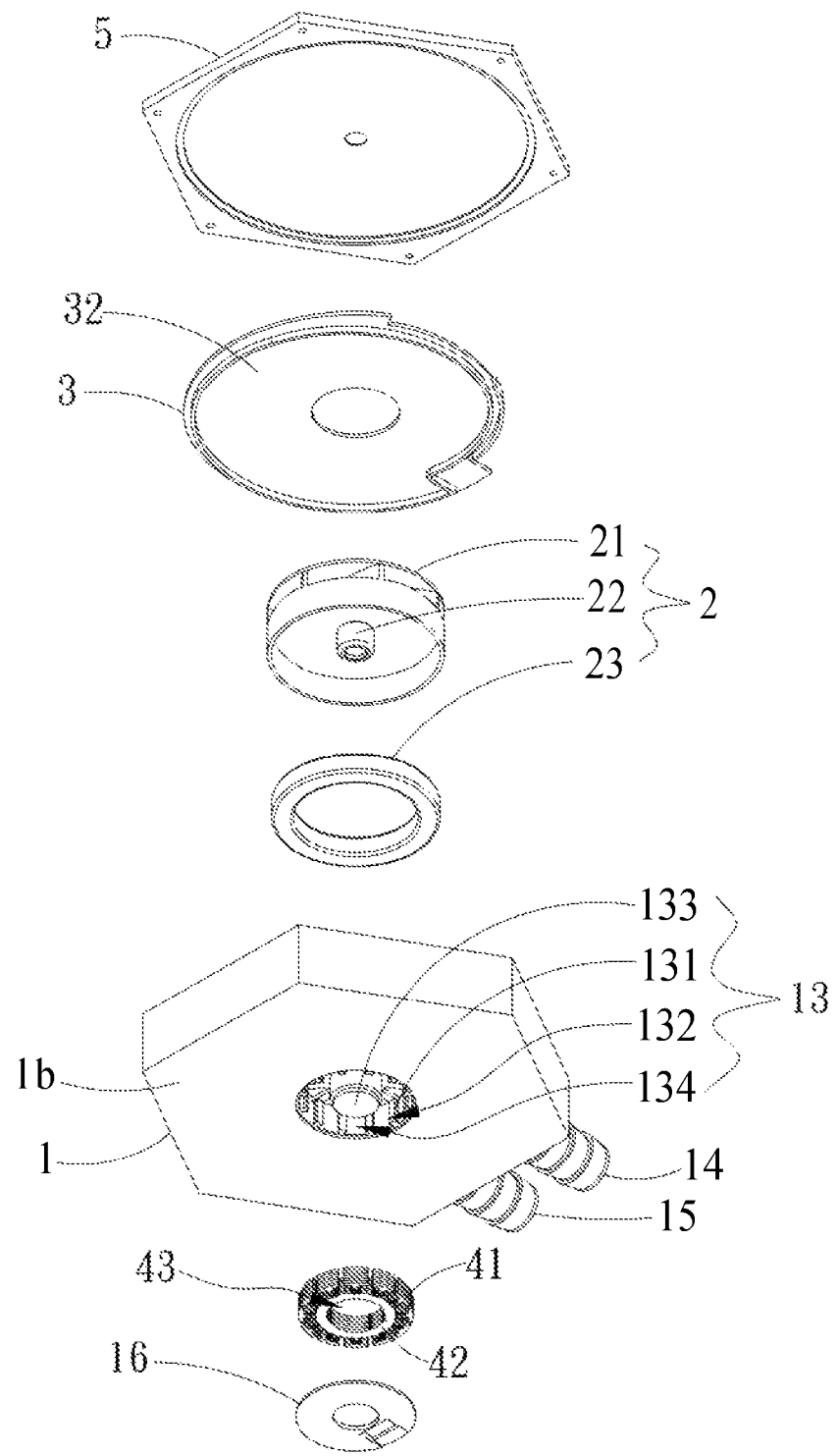
FIG. 3B is an exploded bottom perspective view of the high-power pump structure according to the second embodiment of the present invention.
Figure 3C:
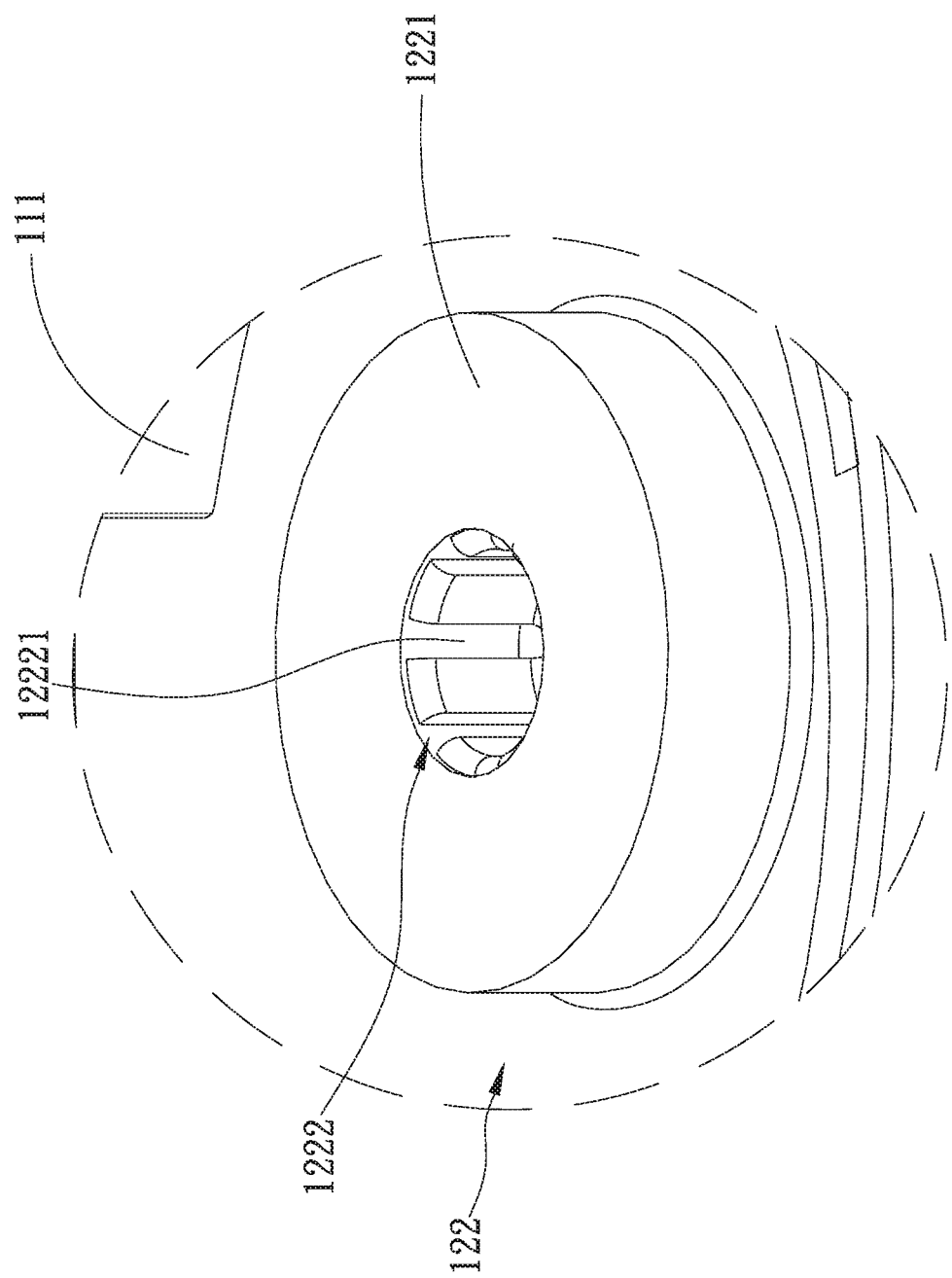
FIG. 3C is an enlarged view of the circled area of FIG. 3A.

Please refer to FIGS. 3A and 3B, which are exploded top and bottom perspective views, respectively, of a high-power pump structure according to a second embodiment of the present invention, and to FIG. 3C, which is an enlarged view of the circled area of FIG. 3A. Since the second embodiment is generally similar to the first one, the structural portions that are the same in the first and the second embodiment are not repeatedly described herein. Unlike the first embodiment, the second embodiment includes an outer-rotor assembly. In this case, adaptive changes are made to the pivot section 1221 and the annular recess 13 in the second embodiment, such as the sizes of the pivot section 1221 and the annular recess 13, and/or the quantity of the ribs 131 and the size of the spaces 132. Further, in the second embodiment, a plurality of axially extended grooves 12221 is formed on an inner circumferential wall of the receiving opening 1222. When the working liquid flows into the receiving opening 1222, the grooves 12221 and the working liquid that serves as a medium together make the receiving opening 1222 a hydrodynamic grooved bearing structure for the rotor assembly 2. This design can further upgrade the rotation efficiency of the rotor assembly 2.

The second embodiment is also different from the first one in the relative positions of the blade wheel 21, the magnetic element 23 and the pivot section 1221. More specifically, in the second embodiment, the through hole 231 of the magnetic element 23 is sized corresponding to an outer diameter of the pivot section 1221, so that the magnetic element 23 is externally fitted around the pivot section 1221 and accordingly located corresponding to a circumferential outer side of the stator assembly 4 that is fitted in the annular recess 13, and the rotary shaft 22 of the blade wheel 21 is correspondingly inserted into the receiving opening 1222 that has the grooves 12221 spaced therein.

In either of the first or the second embodiment, the partitioning section 11, the flow-guiding plate 111, the pivot section 1221 and the fitting sleeve 133 are integrally formed with the housing 1. However, in other operable embodiments, the housing 1, the partitioning section 11, the flow-guiding plate 111, the pivot section 1221 and the fitting sleeve 133 can be independently formed according to actual need and then assembled together to constitute a complete pump structure of the same function.

Further, in the above embodiments, the housing 1 and the closing member 5 are illustrated as hexagonal in shape. In this case, a fastening section is provided on each of the six internal angles of the housing 1, and a mating fastening structure is provided on each of the six internal angles of the closing member 5 for correspondingly connecting to the fastening sections. More specifically, the closing member 5 can be connected to the housing 1 by snap-fitting, tight-fitting, glue-bonding, or screw-fastening, In the illustrated embodiments, the control circuit 161 is provided on a flexible printed circuit board. However, in other operable embodiments, the control circuit 161 can be formed on a general printed circuit board or other equivalent objects. Alternatively, the control circuit 161 can be directly integrated with the stator assembly 4 or the annular recess 13 to save the cost and space for an additional circuit board.

The stator cover 16 is not prerequisite in the pump structure of the present invention. In an operable embodiment, after the stator assembly 4 has been fitted in the annular recess 13, the annular space 134 of the annular recess 13 can be sealed by filling it with an epoxy, for example, to achieve even better structural strength and water-tightness for the entire pump structure.

Compared to the conventional pump structure, the high-power pump structure according to the present invention has the following advantages: (1) reducing the occurrence of turbulence in the working liquid and accordingly enabling the high-power operation of the pump structure; (2) enabling enhanced electromagnetic induction and magnetic field generation and accordingly the high-power operation of the pump structure; and (3) utilizing the working liquid as a medium to provide the function of a hydrodynamic grooved bearing and accordingly enabling the high-power operation of the pump structure.

The present invention has been described with some preferred embodiments thereof and it is understood that many changes and modifications in the described embodi-

What is claimed is:

1. A power pump structure, comprising:
a housing having a first side and an opposite second side; on the first side there being formed an upward-opened pump chamber and a partitioning section; the partitioning section dividing the pump chamber into a first chamber and a second chamber and including a flow-guiding plate formed at an end thereof such that the second chamber, the flow guiding plate and the partitioning section define a circular inner wall structure in the housing; the second chamber having a pivot section raised therefrom; and the pivot section having a centered receiving opening; and on the second side, there being formed a downward-opened annular recess, which is defined on a rear or bottom side of the raised pivot section;
a rotor assembly being located in the second chamber and including a blade wheel and a toroidal magnetic element; the toroidal magnetic element being selectively fitted in the receiving opening of the pivot section; the blade wheel including a rotary shaft, which is downward extended from the blade wheel and inserted into a central through hole of the toroidal magnetic element with the magnetic element being fitted in the receiving opening of the pivot section, the arrangement being such that the blade wheel remains at a fixed distance from the circular inner wall structure;
an isolating plate covering around the rotor assembly and a top of the second chamber, such that the second chamber is not directly communicable with the first chamber;
a stator assembly being fitted in the annular recess; and
a closing member being correspondingly covered on the first side of the housing with a communicating chamber formed between the closing member and the isolating plate; and the communicating chamber being communicable with the first and the second chamber.

2. The power pump structure as claimed in claim 1, wherein the flow-guiding plate is integrally formed with the partitioning section to create a flow guiding effect.

3. The power pump structure as claimed in claim 1, wherein the annular recess has a plurality of axially extended ribs spaced on along a radially inner circumferential wall of the annular recess, such that a space is formed between any two adjacent ribs.

4. The power structure as claimed in claim 3, wherein the stator assembly includes a plurality of poles, which are respectively located in the spaces formed between any two adjacent ribs.

5. The power pump structure as claimed in claim 3, wherein the radially inner circumferential wall of the annular recess forms a downward extended fitting sleeve, which is correspondingly defined on a rear side of the receiving opening of the pivot section; and wherein the stator assembly consists of a plurality of silicon steel sheets and has a central opening; and the central opening of the stator assembly being fitted around the fitting sleeve.

6. The power pump structure as claimed in claim 1, wherein the housing further includes a water inlet and a water outlet provided on a peripheral wall thereof to communicate with the first chamber and the second chamber, respectively.

7. The power pump structure as claimed in claim 1, wherein the receiving opening of the pivot section is provided on an inner circumferential wall with a plurality of axially extended grooves, and the grooves being communicable with the second chamber.

8. The high-power pump structure as claimed in claim 1, wherein the isolating plate has a top surface and a bottom surface; the top surface being located at a predetermined distance below the closing member, and the bottom surface overlaying the rotor assembly.

9. The power pump structure as claimed in claim 1, wherein the rotor assembly is an inner-rotor assembly, such that the rotary shaft of the blade wheel is inserted into the through hole of the magnetic element and the magnetic element is fitted in the receiving opening of the pivot section.

10. The power pump structure as claimed in claim 1, wherein the housing further includes a stator cover, which correspondingly covers the stator assembly and has a control circuit provided thereon.

11. The power pump structure as claimed in claim 1, wherein the housing further includes a locating groove provided on a top of the first side around the pump chamber, and a sealing element correspondingly fitted in the locating groove.

* * * * *